(12) United States Patent
Lai

(10) Patent No.: US 8,354,284 B2
(45) Date of Patent: Jan. 15, 2013

(54) LED MODULE AND METHOD OF MANUFACTURING THE SAME

(75) Inventor: Chih-Chen Lai, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 248 days.

(21) Appl. No.: 12/818,122

(22) Filed: Jun. 17, 2010

(65) Prior Publication Data

US 2011/0254029 A1      Oct. 20, 2011

(30) Foreign Application Priority Data

Apr. 19, 2010    (TW) .............................. 99112203 A

(51) Int. Cl.
*H01L 21/00*    (2006.01)

(52) U.S. Cl. ..................... 438/28; 438/34; 257/E33.055

(58) Field of Classification Search ................. 438/28, 438/34; 257/E33.055
See application file for complete search history.

(56) References Cited

U.S. PATENT DOCUMENTS 5,453,405 A * 9/1995 Fan et al. ................... 438/34

* cited by examiner

*Primary Examiner* — Stephen W Smoot
*Assistant Examiner* — Vicki B Booker
(74) *Attorney, Agent, or Firm* — Altis Law Group, Inc.

(57) ABSTRACT

An exemplary LED module includes a base, an anisotropic conductive film on the base, multiple LED dies on the anisotropic conductive film, multiple first electrodes between the base and the anisotropic conductive film, and multiple second electrodes on the LED dies. The LED dies are arranged in multiple rows by multiple columns. The first electrodes each are elongated and parallel to each other. The second electrodes each are elongated and parallel to each other. The LED dies of each column are connected to one of the first electrodes electrically. Each second electrode is electrically coupled to the LED dies of one row.

6 Claims, 11 Drawing Sheets

LED MODULE AND METHOD OF MANUFACTURING THE SAME

BACKGROUND

1. Technical Field

The present disclosure relates to light emitting diode (LED) modules, and particularly to a method for manufacturing an LED module incorporating a plurality of LEDs.

2. Description of Related Art

Presently, LED modules are preferred for use in non-emissive display devices than CCFLs (cold cathode fluorescent lamp) due to their high brightness, long lifespan, and wide color range.

In manufacturing an LED module, most of the methods involve the following steps. Firstly, an LED wafer is provided and cut into a plurality of LED dies. Each of the LED dies is then individually connected to a circuit board through wire bonding, and encapsulated by transparent material to form an LED. Finally, the LEDs are assembled together to form the LED module. However, the LEDs are formed separately at a time, which is costly, time-consuming and may require substantial amounts of manual labor and/or specialized equipment.

What is needed, therefore, is a new method for manufacturing an LED module with a plurality of LEDs which can overcome the limitations described.

DETAILED DESCRIPTION

Figure 1:
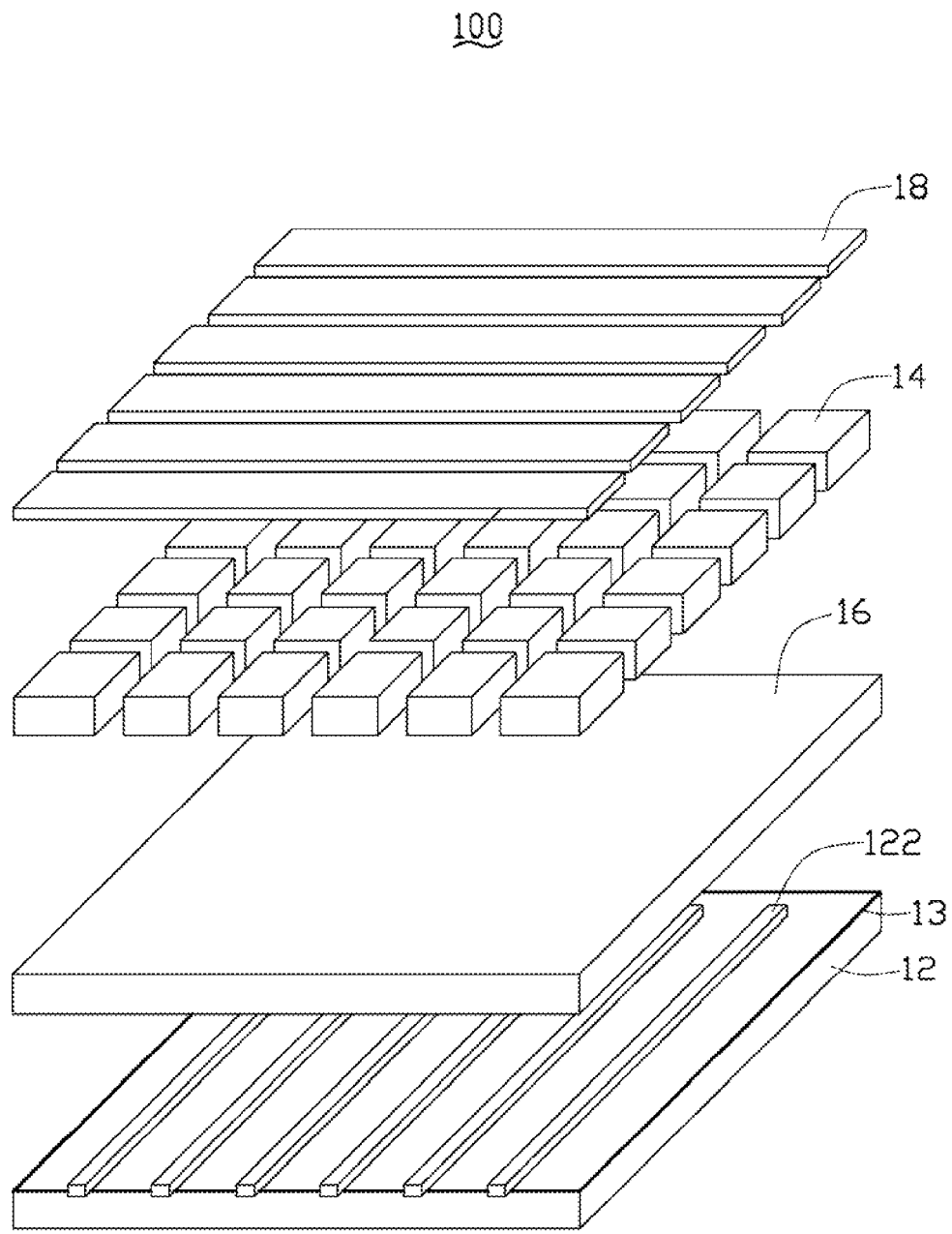
FIG. 1 is a schematic view of an LED module in accordance with an embodiment of the disclosure.

Referring to FIG. 1, an LED module 100 in accordance with an exemplary embodiment of the disclosure is shown. The LED module 100 includes a base 12, a plurality of LED dies 14 arranged over the base 12, a plurality of first electrodes 122 provided on the base 12, an anisotropic conductive film (ACF) layer 16 interconnecting the first electrodes 122 and the LED dies 14, and a plurality of second electrodes 18 provided on the LED dies 14. Preferably, in this embodiment, the LED dies 14 are arranged in multiple rows and multiple columns, as a matrix.

The base 12 is rectangular and flat. The base 12 can be made of metallic materials, such as copper, copper-alloy, aluminum and aluminum-alloy. Alternatively, the base 12 can be of nonmetal materials, such as silicon and ceramic. The first electrodes 122 are evenly distributed on and electrically insulated from the base 12. In this embodiment, each of the first electrodes 122 is elongated. A number of the first electrodes 122 correspond to the number of columns of the LED dies 14.

The ACF layer 16 is adhered on the base 12, and encapsulates all of the first electrodes 122. The LED dies 14 are fixed to the base 12 by the ACF layer 16. The ACF layer 16 provided between the LED dies 14 and the base 12 can buffer a force between the LED dies 14 and the base 12 when the LED module 100 is heated, avoiding deformation of the LED module 100. In this embodiment, the LED dies 14 of each column are located over one corresponding first electrode 122, and electrically coupled to the corresponding first electrode 122 via the ACF layer 16. Since the ACF layer 16 is just electric conducted vertically, open circuit is formed between the LED dies 14 of different columns.

The second electrodes 18 each are elongated, and evenly spaced from each other. In this embodiment, the second electrodes 18 are transparent conducting layers (TCLs) fixed on the LED dies 14. Each of the second electrodes 18 connects the LED dies 14 of one row. Thus electric power can be supplied to the LED dies 14 via the first electrodes 122 and the second electrodes 18 to cause the LED dies 14 to emit light.

Figure 2:
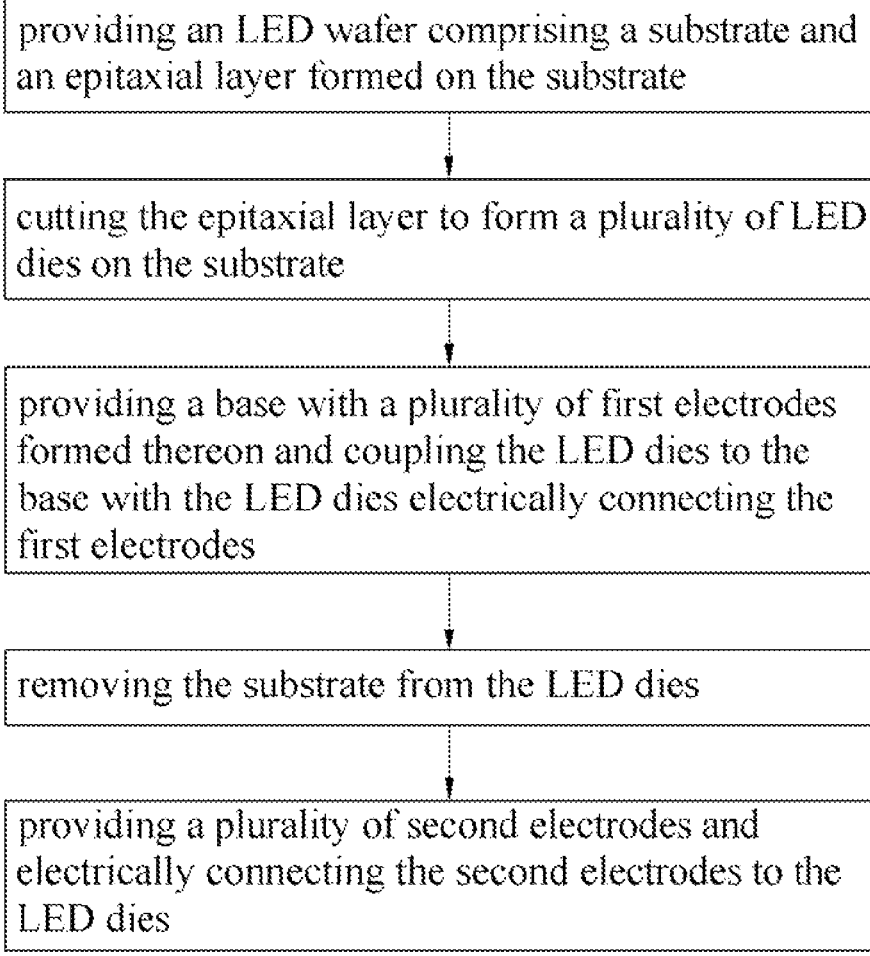
FIG. 2 is a flow chart showing a method for manufacturing the LED module in accordance with the embodiment of the disclosure of FIG. 1.

Referring to FIG. 2, a flow chart of a method for manufacturing the LED module 100 in accordance with the embodiment is shown. The method mainly includes steps of: providing an LED wafer comprising a substrate and an epitaxial layer formed on the substrate; cutting the epitaxial layer to form a plurality of LED dies on the substrate; providing a base with a plurality of first electrodes formed thereon and coupling the LED dies to the base with the LED dies electrically connecting the first electrodes; removing the substrate from the LED dies; and providing a plurality of second electrodes and electrically connecting the second electrodes to the LED dies, all of which will be disclosed in detail herebelow.

Figure 3:
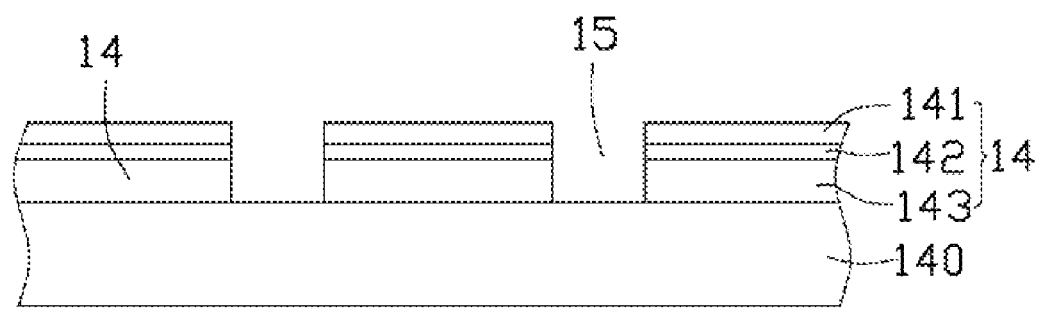
FIG. 3 shows a plurality of LED dies formed by cutting an epitaxial layer of an LED wafer.

Referring to FIG. 3, firstly, an LED wafer 10 is provided. The LED wafer 10 is formed by growing an epitaxial layer on a substrate 140. The substrate 140 is sapphire. The epitaxial layer can be formed on the substrate 140 by metal organic chemical vapor deposition (MOCVD). The epitaxial layer forms as a p-n junction type semiconductor light-emitting structure, which may be gallium nitride-based III-V group compound semiconductor. The epitaxial layer of the LED wafer 10 is cut into a plurality of LED dies 14. The LED dies 14 are arranged in multiple rows and multiple columns on the substrate 140. The LED dies 14 are separated from each other with a gap 15 defined between two neighboring LED dies 14. Each of the LED dies 14 includes an N-type film 143 connected to the substrate 140, an active layer 142 on the N-type film 143 and a P-type film 141 on the active layer 142.

Figure 4:
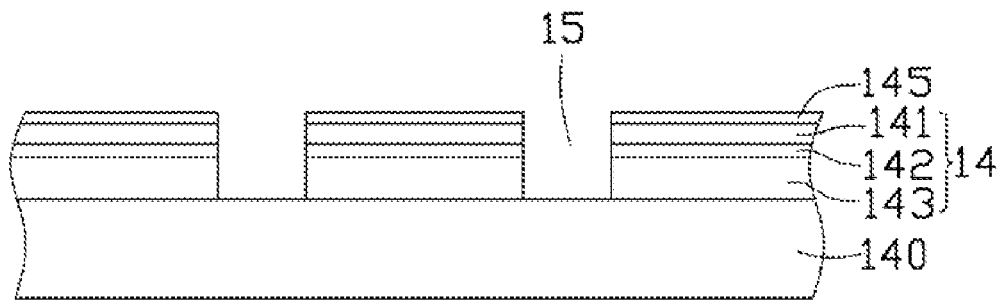
FIG. 4 shows a reflecting layer formed on each of the LED dies of FIG. 3.

Referring to FIG. 4, a reflecting layer 145 is then coated on the P-type film 141 of each of the LED dies 14. The reflecting layer 145 is made of metal, such as aluminum, for reflecting light generated by the active layer 142 of the LED die 14 towards the P-type film 141 back to the N-type film 143.

Figure 5:
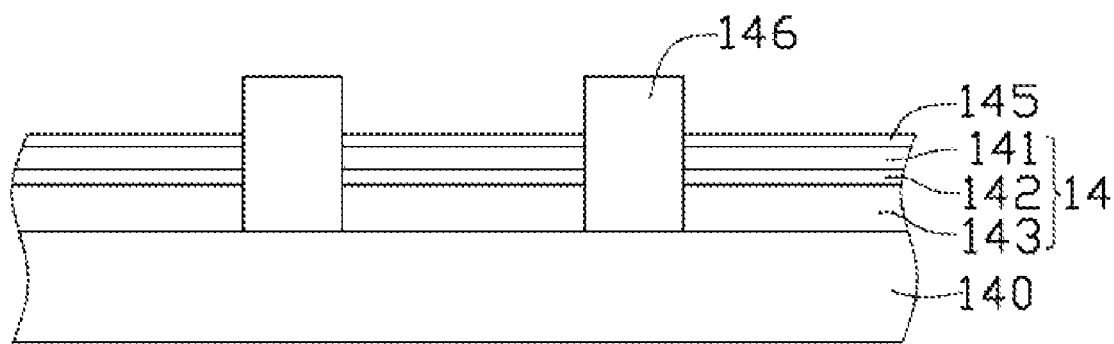
FIG. 5 shows an electrically insulating material filled into a gap between every two neighboring LED dies of FIG. 4.

Referring to FIG. 5, an electrically insulating material 146 is then filled in each gap 15 defined between neighboring LED dies 14. The insulating material 146 may be formed by a photoresist. The neighboring LED dies 14 are insulated from each other by the insulating material 146. The insulating material 146 has a height greater than a height of each of the LED dies 14 such that a top of the insulating material 146 is located above the reflecting layer 145.

Figure 6:
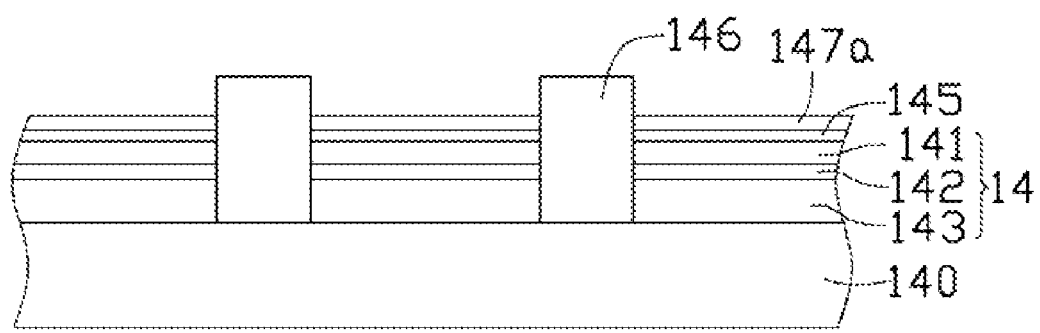
FIG. 6 shows a tin layer formed on the reflecting layer of each LED die of FIG. 5.
Figure 7:
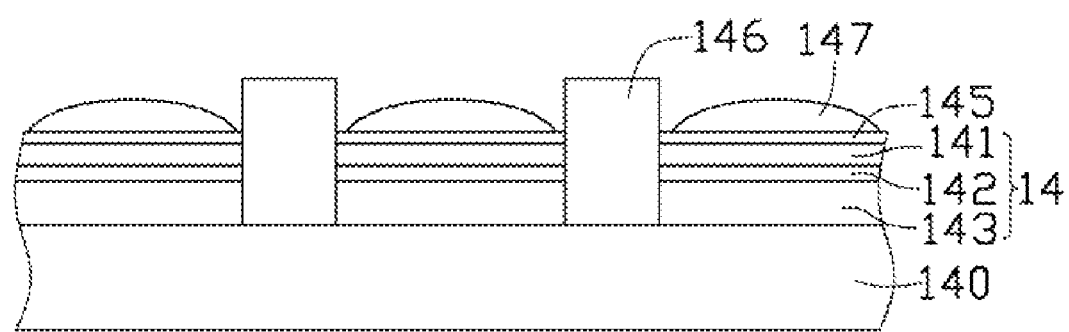
FIG. 7 is similar to FIG. 6, but shows the tin layers being heated to form tin balls.

As shown in FIGS. 6 and 7, a tin ball 147 is then formed on each reflecting layer 145. The tin balls 147 are electrically connected to the P-type films 141 of the LED dies 14 via the reflecting layers 145. To form the tin balls 147, firstly, as shown in FIG. 6, a planar tin layer 147a is formed on each of the reflecting layers 145, and then the tin layer 147a reflows under a temperature ranging from 180~250 Celsius degrees to form the tin ball 147 shown in FIG. 7. The tin balls 147 are not higher than the insulating material 146.

Figure 8:
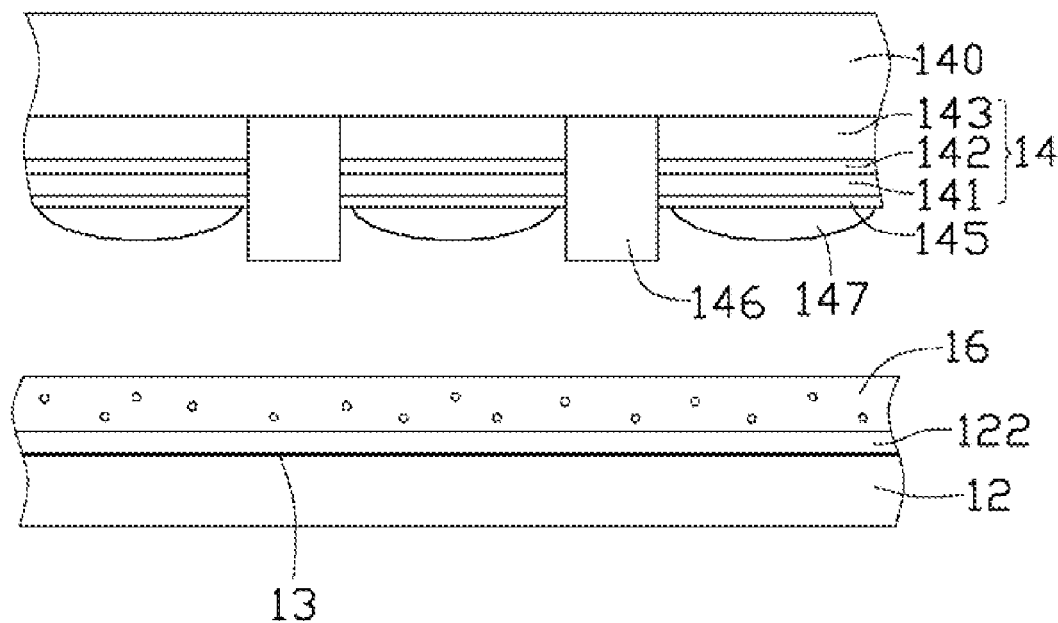
FIGS. 8-9 show the LED dies of FIG. 7 being assembled to a base by an anisotropic conductive film.
Figure 9:
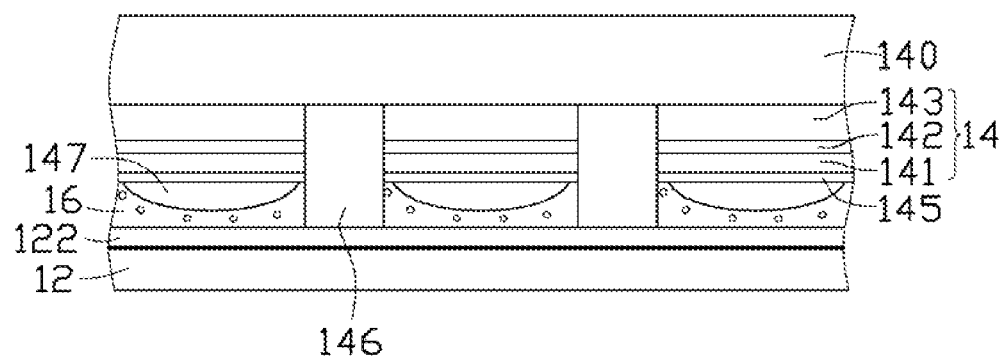

Referring to FIGS. 8 and 9, a base 12 is then provided with a plurality of first electrodes 122 formed thereon. Preferably, the base 12 is made of materials with high heat conductive efficiency, such as copper, copper-alloy, aluminum and aluminum-alloy. Alternatively, the base 12 can be of silicon and ceramic. An electrically insulating layer 13 is formed on the base 12 to electrically insulate the base 12 from the first electrodes 122 when the base 12 is metal. The amount, shape and position of the first electrodes 122 are decided according to the LED dies 14. An ACF layer 16 is adhered on the base 12 and covers all of the first electrodes 122.

The substrate 140 and the LED dies 14 are inverted and pressed against the ACF layer 16 to bring the tin balls 147 on the LED dies 14 into contact with the ACF layer 16, and a top of each insulating material 146 is inserted into the ACF layer 16 and abuts the base 12. Thus, the P-type films 141 of the LED dies 14 each are electrically connected to the first electrode 122 via contact between the tin balls 147 and the ACF layer 16. Due to the presence of the insulating material 146 between the LED dies 14, a possible short circuit between every two neighboring LED dies 14 is avoided.

Figure 10:
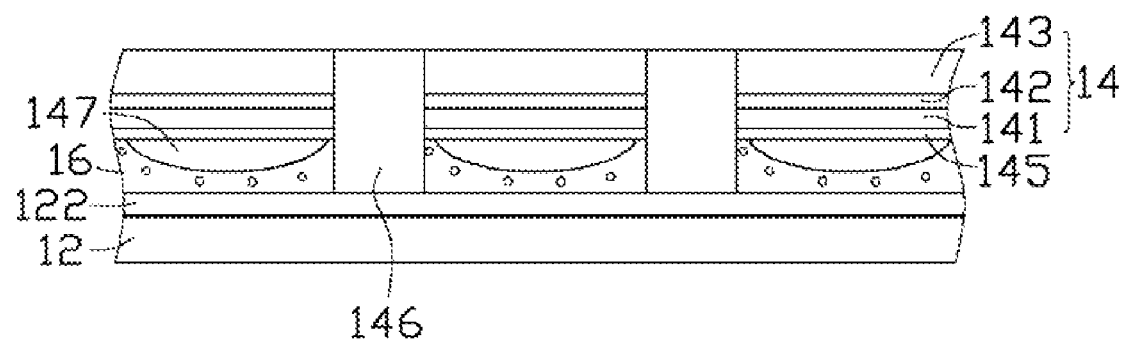
FIG. 10 shows a substrate of the LED wafer being removed to expose the LED dies.
Figure 11:
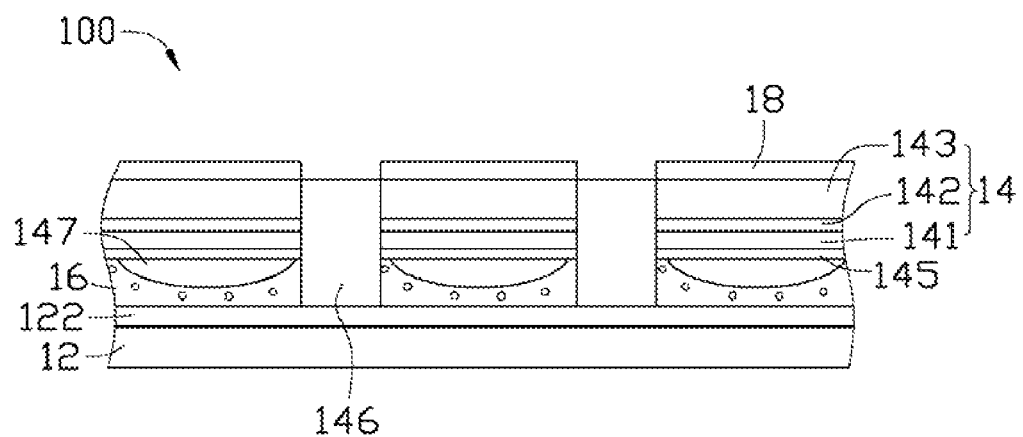
FIG. 11 shows second electrodes coupled to the LED dies to form the LED module.

Referring to FIG. 10, the substrate 140 is then removed from the LED dies 14 by laser lift-off, thereby exposing the N-type films 143 of the LED dies 14. Thus, as shown in FIG. 11, the second electrodes 18 can be then coupled the N-type films 143 of the LED dies 14. Therefore, the P-type film 141 and the N-type film 143 of each LED die 14 are respectively connected to the first electrode 122 and the second electrode 18. Since the P-type films 141 of all of the LED dies 14 can be coupled to the first electrodes 122 simultaneously, and the N-type films 143 of all of the LED dies 14 can be coupled to the second electrodes 18 simultaneously, time for connecting the LED dies 14 is significantly reduced. And, finally, all of the LED dies 14 can be encapsulated simultaneously to obtain the LED module 100 with a plurality of LED dies 14. Therefore, production efficiency of the LED module 100 is improved, and correspondingly a cost for producing the LED module 100 is reduced.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing an LED module, comprising steps of:
   providing an LED wafer comprising a substrate and an epitaxial layer formed on the substrate;
   cutting the epitaxial layer to form a plurality of LED dies on the substrate, the LED dies being arranged in multiple columns by multiple rows, each of the LED dies comprising a first layer connected to the substrate and a second layer farthest away the substrate;
   filling an insulating material in a gap defined between each two neighboring LED dies before coupling the LED dies to the base;
   providing a base with a plurality of first electrodes formed thereon and coupling the LED dies to the base, each first electrode electrically connecting the second layers of the LED dies of one column;
   removing the substrate to expose the first layers of the LED dies; and
   providing and coupling a plurality of second electrodes to the first layers of the LED dies, each second electrode electrically connecting the first layers of the LED dies of one row.

2. The method of claim 1, further comprising coating a reflecting layer on the second layer of each of the LED dies before filling the insulating material.

3. The method of claim 2, further comprising forming a tin ball on each of the reflecting layer before coupling the LED dies to the base.

4. The method of claim 3, wherein forming the tin ball comprises steps of: forming a planar tin layer on the reflecting layer, and then reflowing the tin layer under a temperature ranging from 180~250 Celsius degrees to form the tin ball.

5. The method of claim 4, wherein an anisotropic conductive film is provided on the base and covers the first electrodes, the second layers of the LED dies electrically connecting the first electrodes via the anisotropic conductive film when the LED dies is coupled to the base, the insulating material extending through the anisotropic conductive film.

6. The method of claim 5, wherein the tin balls contact the anisotropic conductive film directly.

\* \* \* \* \*